(12) United States Patent
Ranade et al.

(10) Patent No.: US 10,060,019 B2
(45) Date of Patent: Aug. 28, 2018

(54) THERMAL SPRAY COATED REINFORCED POLYMER COMPOSITES

(71) Applicant: THE BOEING COMPANY, Chicago, IL (US)

(72) Inventors: Alpana N. Ranade, Renton, WA (US); Marvi A. Matos, Seattle, WA (US); Arash Ghabchi, Seattle, WA (US)

(73) Assignee: The Boeing Company, Chicago, IL (US)

( * ) Notice: Subject to any disclaimer, the term of this patent is extended or adjusted under 35 U.S.C. 154(b) by 252 days.

(21) Appl. No.: 13/679,399

(22) Filed: Nov. 16, 2012

(65) Prior Publication Data

US 2014/0141257 A1    May 22, 2014

(51) Int. Cl.
| | |
|---|---|
| C23C 4/12 | (2016.01) |
| C23C 14/06 | (2006.01) |
| C23C 4/02 | (2006.01) |
| C23C 4/06 | (2016.01) |
| C23C 14/00 | (2006.01) |
| C23C 28/00 | (2006.01) |
| C23C 24/04 | (2006.01) |
| C23C 14/35 | (2006.01) |

(52) U.S. Cl.
CPC ............... *C23C 4/12* (2013.01); *C23C 4/02* (2013.01); *C23C 4/06* (2013.01); *C23C 14/0036* (2013.01); *C23C 14/0084* (2013.01); *C23C 14/0635* (2013.01); *C23C 14/35* (2013.01); *C23C 24/04* (2013.01); *C23C 28/324* (2013.01); *C23C 28/36* (2013.01); *Y10T 428/31678* (2015.04); *Y10T 428/31725* (2015.04)

(58) Field of Classification Search
CPC . C23C 14/0084; C23C 14/0635; C23C 14/35; C23C 24/04; C23C 8/324; C23C 8/36; C23C 4/12; C23C 14/0036; C23C 28/34; C23C 4/02; C23C 4/06; C23C 28/36; C23C 28/324; Y10T 428/31678; Y10T 428/31725
USPC ............... 427/446, 455, 456; 204/192.14; 428/446, 688
See application file for complete search history.

(56) References Cited

U.S. PATENT DOCUMENTS

| | | | | |
|---|---|---|---|---|
| 5,939,201 A | * | 8/1999 | Boire et al. | 428/432 |
| 6,818,309 B1 | * | 11/2004 | Talpaert et al. | 428/432 |
| 6,982,116 B1 | | 1/2006 | Passman et al. | |

(Continued)

FOREIGN PATENT DOCUMENTS

| | | | |
|---|---|---|---|
| CN | 1269759 C | | 8/2006 |
| DE | 102008028540 | * | 12/2009 |

(Continued)

OTHER PUBLICATIONS

Plasma Therm, accessed online Jan. 22, 2016.*

(Continued)

*Primary Examiner* — Camie S Thompson
(74) *Attorney, Agent, or Firm* — Christopher J. Knors; Moore & Van Allen PLLC (57) ABSTRACT

Forming and depositing a high temperature inorganic coating on a polymeric composite substrate surfaces having deposited thereon an interlayer, and articles produce therefrom. Methods of providing functional properties to said composites are also disclosed.

14 Claims, 3 Drawing Sheets

(56) References Cited

U.S. PATENT DOCUMENTS

| | | | |
|---|---|---|---|
| 7,976,909 B2* | 7/2011 | Durandeau | C23C 16/405 427/248.1 |
| 2005/0118504 A1 | 6/2005 | Honda et al. | |
| 2008/0056905 A1* | 3/2008 | Golecki | C23C 30/00 416/241 R |
| 2008/0284971 A1* | 11/2008 | Park | G02F 1/133305 349/158 |
| 2010/0239742 A1* | 9/2010 | Larson-Smith et al. | 427/8 |
| 2012/0308842 A1* | 12/2012 | Schmidt | C23C 28/3215 428/614 |

FOREIGN PATENT DOCUMENTS

| | | |
|---|---|---|
| EP | 1895021 A1 | 3/2008 |
| JP | 07157384 A | 6/1995 |
| JP | 11-124693 A | 5/1999 |
| WO | 01/24250 A1 | 4/2001 |
| WO | 0146324 A2 | 6/2001 |
| WO | WO 10/46324 A2 | 6/2001 |

OTHER PUBLICATIONS

Canadian Patent Office; Office Action for Canadian Patent Application No. 2,824,830 dated Dec. 28, 2017, 4 Pages.

Chinese Patent Office, Office Action for Chinese Patent Application No. 2013105766188 dated Aug. 31, 2017, 25 Pages.

Japanese Patent Office; Office Action for Japanese Patent Application No. 2013-225975 dated Aug. 29, 2017, 7 Pages.

Sturgeon, et al., "Cold Sprayed Coatings for Polymer Composite Substrates," Proc. of the 10th ISMSE & the 8th ICPMSE, Colliore, France, Jun. 2006, pp. 1-5.

Narayan, Roger J., "Adhesion Properties of functionally Gradient Diamond Composite Films on Medical and Tool Alloys." J. Adhesion Sci. Technol., vol. 18, No. 12, 2004, pp. 1339-1365.

Lugscheider et al., "Mechanical Properties of Thermal Sprayed Coatings on CFRP," Proceedings of the 5th National Thermal Spray Conference, Jun. 1993, pp. 569-573.

Lugscheider et al., "Thermal Sprayed Coatings for Carbon Reinforced Plastices—Research, Development and Applications." pp. 28-31.

Canadian Intellectual Property Office; Canadian Office Action for Application No. 2,824,830 dated Sep. 1, 2015, 3 Pages.

European Patent Office; European Applicaiton No. 13184586.9 Extended European Search Report dated Mar. 17, 2014, 7 pages.

Ivosevic et al., "Solid Particle Erosion Resistance of Thermally Sprayed Functionally Graded Coatings for Polymer Matrix Composites," Surface & Coatings Tecnology, 2006, pp. 5145-5151.

Robitaille et al., "Metallic Coating of Aerospace Carbon/Epoxy Composites by the Pulsed Gas Dynamic Spraying Process," Surface & Coatings Technology, 2009, pp. 2954-2960.

Japanese Patent Office; Office Action for Japanese Patent Application No. 2013-225975 dated Apr. 3, 2018, 4 Pages.

Chinese Patent Office; Office Action for Chinese Patent Application No. 201310576618.8 dated Jan. 15, 2018, 9 Pages.

* cited by examiner

THERMAL SPRAY COATED REINFORCED POLYMER COMPOSITES

TECHNICAL FIELD

This disclosure relates to forming and depositing a high temperature inorganic coating on a polymeric composite substrate surfaces having deposited thereon an interlayer film and articles produce therefrom. Methods of providing functional properties to said composites are also disclosed.

BACKGROUND

Despite having high strength, certain fiber reinforced organic polymers exhibit low wear resistance, low thermal and electrical conductivity that limit their use in demanding applications. One approach to address these deficiencies is to apply coating with desired performance on the fiber reinforced organic polymers. It is a challenge to enable the adhesion of a wide variety of materials on such composites, in part due to presence of chemically, mechanically and thermally unstable matrix resin. Currently, the coating of different materials on fiber reinforced organic polymers is typically enhanced by means of plasma treatment and etching, chemical and mechanical treatment of the surface. Other limitations of such composites include poor adhesion of thermal spray coatings. Coating of different, inorganic materials on such composites typically requires plasma treatment and/or etching, chemical and/or mechanical treatment of the surface, each of which has drawbacks and/or adds cost and processing time to finished articles. To address the current deficiencies that are mainly related to surface characteristics of composites, different surface coatings can be applied, however, one of the main challenges in coating (e.g. thermal spray coating technology) certain composite surfaces is degradation, e.g., the epoxy used in CFRPs. In addition to the above, many composite materials which contain a mixture of organic and inorganic material can be altered or otherwise structurally compromised during such high temperature/high velocity coating processes. Thus, many composite materials cannot be used in more demanding applications

SUMMARY

In one embodiment, a composite is provided, the composite comprising: a substrate comprising a reinforced organic polymer matrix, the substrate having a substrate surface; at least one interlayer on the substrate surface, the interlayer having a thickness extending vertical from the substrate, and a compositional gradient of at least one chemical element within at least a portion of the thickness extending vertical; and at least one inorganic coating deposited on at least a portion of the interlayer.

In an aspect, the reinforced organic polymer matrix is a fiber reinforced polymer chosen from carbon fiber reinforced polymer, glass fiber reinforced polymer, carbon nanotube reinforced polymer, Kevlar fiber reinforced polymer or ceramic fiber reinforced polymer.

In another aspect, alone or in combination with one aspect, the interlayer comprises silicon, oxygen, and carbon.

In another aspect, alone or in combination with any of the previous aspects, the interlayer consists essentially of silicon oxycarbide.

In another aspect, alone or in combination with any of the previous aspects, the at least one chemical element is oxygen, carbon, nitrogen, sulfur, or halogen.

In a further aspect, alone or in combination with any of the previous aspects, the compositional gradient comprises a varying concentration of the at least one element within the thickness.

In a further aspect, alone or in combination with any of the previous aspects, the varying concentration comprises a carbon-rich interlayer portion in proximity to the substrate and an oxygen-rich, or nitrogen-rich, or nitride-rich interlayer portion in proximity to the inorganic coating.

In a further aspect, alone or in combination with any of the previous aspects, the concentration gradient of the at least one chemical element is essentially linear within the thickness of the interlayer, is essentially step-wise within the thickness of the interlayer, or is a plurality of concentration gradients within the thickness of the interlayer.

In a further aspect, alone or in combination with any of the previous aspects, the inorganic coating is a metal, a metal alloy, ceramic, or combination thereof.

In a further aspect, alone or in combination with any of the previous aspects, the metal is copper (Cu), silver (Ag), platinum (Pt), palladium (Pd), gold (Au), aluminum (Al), titanium (Ti) and alloys thereof.

In a further aspect, alone or in combination with any of the previous aspects, the metal alloy is ferrous alloys, WC—Co, WC—Co—Cr, NiAl, CrC—NiCr, molybdenum disulfide ($MoS_2$) or MCrAlY, wherein M is Co, Ni or Co/Ni.

In a further aspect, alone or in combination with any of the previous aspects, the ceramic is one or more refractory oxides selected from the group of zirconia, alumina, and yttrium-stabilized zirconium (YSZ)

In another embodiment, a method for providing a coated polymeric composite substrate is provided, the method comprising: depositing, on a polymeric composite substrate surface, a thickness of an interlayer having a varying concentration gradient of at least one chemical element within at least a portion of the thickness; embedding or infusing inorganic material into at least a portion of the interlayer via a high temperature and kinetically driven spray; and forming a coating of the inorganic material on at least a portion of the interlayer and composite substrate surface.

In one aspect, the method further comprises eliminating or reducing chemical or physical alteration to at least a portion of the composite substrate by the kinetic inorganic particles.

In another aspect, alone or in combination, the polymeric composite is a fiber reinforced organic polymer matrix chosen from carbon fiber reinforced polymer, glass fiber reinforced polymer, carbon nanotube reinforced polymer, Kevlar fiber reinforced polymer or ceramic fiber reinforced polymer.

In another aspect, alone or in combination with any of the previous aspects, the interlayer comprises silicon, oxygen, and carbon.

In a further aspect, alone or in combination with any of the previous aspects, the interlayer consists essentially of silicon oxycarbide.

In a further aspect, alone or in combination with any of the previous aspects, the depositing of the inorganic material is by thermal spraying.

In a further aspect, alone or in combination with any of the previous aspects, the inorganic material is a metal, a metal alloy, ceramic, or combination thereof.

In a further aspect, alone or in combination with any of the previous aspects, the inorganic material are copper (Cu), silver (Ag), platinum (Pt), palladium (Pd), gold (Au), aluminum (Al), titanium (Ti) and alloys thereof, ferrous alloys, WC—Co, WC—Co—Cr, NiAl, CrC—NiCr, molybdenum disulfide (MoS2), zirconia, alumina, and yttrium-stabilized zirconium (YSZ),or MCrAlY, wherein M=Co, Ni or Co/Ni.

In a further aspect, alone or in combination with any of the previous aspects, the interlayer is deposited by a vapor phase deposition technique, a sputtering technique, or plasma deposition technique, or combinations thereof.

In another embodiment, an article is provided comprising a fiber reinforced organic polymer composite substrate; a thickness of an interlayer directly on the composite substrate, the interlayer having a concentration gradient of at least one chemical element within at least a portion of the thickness of the interlayer; and an inorganic coating at least partially embedded in or infused with the interlayer, the inorganic coating providing one or more of anti-wear, anti-abrasion, anti-corrosion, restorative, electrical and/or thermal conductance, and anti-friction properties to the composite substrate.

In one aspect, the interlayer consists essentially of silicon oxy-carbide having an inverse relationship of the concentration of carbon to oxygen in a least a portion of the thickness of the silicon oxy-carbide interlayer.

In another aspect, alone or in combination, the article is a component of a vehicle, an aerospace vehicle, watercraft, or construction element.

DETAILED DESCRIPTION

It has been technically difficult to improve performance and add functionality to a reinforced polymer composites by means of high temperature and/or coating techniques in view of the effects discussed above. The present disclosure is therefore directed to providing a composite material suitable for receiving a high temperature and/or kinetic coating with reduced or eliminated alteration to the composite organic matrix.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, or "deposited on" it can be directly on, or extend directly onto, or be deposited directly on the other element or intervening elements may also be present. In contrast, when an element is referred to as being "directly on" or extending "directly onto" or "deposited directly onto" another element, there are no intervening elements present. It will be understood that these terms are intended to encompass different orientations of the element in addition to any orientation depicted in the figures.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

As used herein, "kinetic coating" would encompass low and high velocity particle spraying techniques normally associated with such coating processes generally referred to as "thermal spray and cold spray techniques." Particles can be molten and/or semi-molten or in solid phase and range in size and distribution, which includes nanoparticles, micron particles and larger particles. Such high temperature/velocity spray techniques, for example, provide particle velocities of at least 50 m/s, at least 75 m/s, at least 100 m/s, or at least 150 m/s or higher, with an upper limit of about 1200 m/s. By way of example, plasma spraying using a high-temperature plasma jet generated by arc discharge providing typical temperatures >14,000 Centigrade, (suitable for the deposition of refractory materials), provides high particle temperature. As the velocity (and temperature) of the thermally sprayed substance or precursor particles increases, physical or chemical alterations or other detrimental effects of the substrate surface, in particular, carbon-carbon composites and/or their matrix, also increases.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Thermal spray coatings present challenges for composite coatings, in part, due to the low temperature and low abrasion resistance of the polymer resin/matrix used in most composite materials, as well as to thermal and mechanical impact effects from the impinging particles. Processes that raise the temperature of the surface and/or the bulk composite material over its material glass temperature are typically not suitable or useful for coating. While it is possible to use thermal spray techniques while applying very low and controllable bulk temperature on the substrate, localized temperature spikes at the vicinity of high temperature particle impact cause the composite to undergo localized melting or evaporation of a portion of its organic matrix, which, among other detriments, leaves tiny holes on the surface with no deposition of the thermal spray coating. Another problem for coating composites are inconsistencies created on the surface due to high velocity and/or high temperature impact (similar to erosion) of particles. Coatings that are deposited at high particle velocities/temperatures can create inconsistencies in the composite surface during deposition.

Thus, by providing an interlayer of defined structure and/or composition on at least a portion of the substrate, the substrate surface of the composite material is protected during the thermal spray process, making it possible to coat such materials by high temperature and/or high velocity coating techniques, such as thermal spray.

Composite Substrate

In one embodiment, a fiber reinforced polymer composite is used as the substrate. Such polymer composites can include engineering resins in combination with organic and/or inorganic reinforcement fiber. An example of a class of engineering resin in combination with reinforcement fiber is carbon fiber reinforced polymers (CFRPs) can be used. Other reinforced polymers can be used. For example engineering plastics can include for example, ultrahigh molecular weight polyethylene, nylon 6, nylon 66, polytetrafluoroethylene, acrylonitrile butadiene styrene, polycarbonates, polyamides, polybutylene terephthalate, polyethylene terephthalate, polyphenylene oxide, polysulfone, polyether ketone, polyether ether ketone, polyamides, polyphenylene sulfide, polyoxymethylene, cyclic olefinic copolymers (COC's), and blends thereof. Other engineering polymers, resins, thermal sets, plastics, and blends thereof can be used in accordance with the methods disclosed and described herein. Exemplary composites include the above engineering resins in combination with carbon nanotubes, glass fibers, Kevlar fibers (e.g., poly-paraphenylene terephthalamide), ceramic fibers, carbon fibers, or combinations thereof. The present disclosure address numerous deficiencies of conventional composite coating processes and coated composites made therefrom when coated with high temperature/high velocity coatings, in particular, inorganic coatings such as metals, metal alloys, and/or ceramics.

By way of example, the substrate can be one or more of carbon fiber reinforced polymers (CFRPs). The interlayer deposition technique and unique coating structural design presently disclosed provides improved adhesion of subsequent coatings to such substrates, while optionally providing additional surface functionality for CFRP. These improved performance and functionalities are achieved by modulation of chemistry of the coating material through the thin film material thickness. The coating material consists of silicon, oxygen and carbon. Precise control of carbon content and the content of reactive species such as oxygen enable improved adhesion to the composite material. A silicon oxy-carbide film is deposited by magnetron sputtering as a single and multilayer structure. Multilayer structure has bottom layer (adjacent to CFRP surface) with a chemical composition that is compatible with the composite material surface. The thin film can transform the chemical, electrical and mechanical presentation of the CFRP composites to the interface, allowing a greater range of applications. This is a specific implementation, but the concept and process can be used on other substrates (e.g., metals and plastics) and with potentially with other thin film materials.

Interlayer Formation

The present disclosure provides, in part, a method of depositing a well adhered thin film (hereinafter also referred to as an "interlayer") on at least a portion of the surface of substrates of organic polymer composites. The deposition technique and interlayer structural design disclosed allow achieving improved adhesion of coatings to substrate and providing additional surface functionality for the composite and to receive subsequent coatings, for example, kinetic and/or high temperature coating techniques and the coatings provided therefrom. These improved performance and functionalities of the composite and their use with such high energy/temperature spray coatings are achieved by controlling and/or modulating of chemistry (e.g., composition) and/or elemental concentration of the interlayer material throughout its thickness (e.g., vertical thickness from substrate surface).

The interlayer structure has a "bottom" layer (adjacent to composite substrate surface) with a chemical composition that is configured for compatibility with the composite material surface. For the aid of describing the interlayer, the interlayer can be referred to as having a "substrate-proximal layer" and a "surface-proximal layer" corresponding to the interface of the interlayer at the substrate surface, and the interface outermost surface, respectively. The interlayer, alone or in combination with a subsequent coating, can transform the chemical, electrical and mechanical presentation of the composite, allowing a greater range of applications. The presently disclosed process can be used on metal or plastic substrates and in combination with other thin film materials and thin-film coating methods. In one aspect, the interlayer can be used to protect a substrate during kinetic/high temperature coating, thus allowing for at least a portion of the substrate to be coated with kinetic or high temperature coatings with reduced or eliminated alteration to the composite.

In one aspect, an interlayer with specific chemical composition on the surface of the composite can be prepared. In other aspects, the present disclosure provides creating a compositional and/or concentration gradient within the vertical thickness of the interlayer where there is variable composition/concentration of at least a first chemical element (e.g., oxygen, carbon, nitrogen, etc.) at the interface between the innermost layer of the interlayer substrate (e.g., the substrate-proximal layer of the composite material), different from that of the thickness of the interlayer in proximity to the outermost layer of the interlayer (surface-proximal layer) so as to provide improved adhesion between the substrate (composite) and the interlayer and/or improved adhesion of subsequent coatings. In certain aspects, the interlayer is configured such that the second concentration of the second chemical element is greater than the first concentration of the first chemical element at the surface-proximal layer.

In one aspect, an interlayer with specific chemical composition on the surface of the composite having a concentration gradient within the interlayer is provided, where there is a first concentration of a first chemical element (e.g., oxygen, carbon, nitrogen, etc.) at the substrate-proximal layer of the composite material, and a second concentration of a second (different) chemical element (e.g., oxygen, carbon, nitrogen, etc.) content at the surface-proximal layer. Thus, in one example, a carbon-rich interlayer portion can be deposited at the substrate-proximal layer, which transitions in a gradient-like manner to an oxygen-rich interlayer portion at the surface-proximal layer of the interlayer.

The interlayer may be deposited using a number of deposition techniques. Such techniques include sputtering, chemical vapor deposition, and plasma deposition. Other processes may be used or combined. In one aspect, the interlayer can be deposited from one of the above deposition techniques utilizing a pre-programmed control of one or more reactant gases.

By way of example, in one aspect, a silicon oxy-carbide film is deposited by magnetron sputtering of a silicon carbide target in the presence of oxygen gas so as to provide a method of preparing and depositing single and multilayer interlayer structures. In one aspect, the oxygen partial pressure is controlled during the magnetron sputtering of the silicon carbide target. Thus, in one aspect, at the beginning of the interlayer deposition process, the oxygen partial pressure is very low or zero and transitions to an increasing amount of oxygen partial pressure over the duration of the interlayer deposition process. In one aspect, the oxygen partial pressure is modified during the interlayer deposition process in a gradient manner. In another aspect, the oxygen partial pressure is modified in a step-like, increasing manner during the deposition process. In yet another aspect, the oxygen partial pressure is modified in a two-step process to provide essentially a dual-layer structure of low/high oxygen content (or high/low carbon content) at the substrate-proximal layer and surface-proximal layer, respectively. One or more of the above-mentioned processes can be repeated one or more times to provide a layered or laminate like interlayer of the same or different gradient structure Oxygen can be replaced by or combined with one or more reactive gases. Reactive gases include hydrogen, oxygen, nitrogen, ammonia, hydrogen sulfide, halogens, halocarbons, etc. Thus, for example, nitrogen or ammonia can be used to provide nitride surface functionality of the composite surface layer. Other chemical functionality can be provided by the selection of the gases used.

The interlayer thus produced can be characterized using for example, time-dependent actinometric optical emission spectroscopy (OES) and/or correlated with composition analysis using XPS and/or Auger electron spectroscopy (AES). Angle resolved XPS data can be used to show compositional and concentration gradients of elemental components of the interlayer within the sampling depth of the technique, corresponding to the vertical thickness of the deposited interlayer relative to the substrate surface.

In another aspect, the interlayer film can comprises ternary silicon oxygen carbide amorphous thin films. Such films can be prepared by sputter deposition. The sputtering maybe performed without direct heating of the substrate. In one aspect, a magnetron-plasma-enhanced chemical vapor deposition (magPECVD) technique can be used to provide the interlayer.

High Temperature and/or Kinetic Coatings

In the methods disclosed herein, a high temperature and/or kinetic coating is applied to the substrate having the interlayer deposited thereon. In one aspect, the high temperature and/or kinetic coating comprises one or more inorganic materials that forms a coating on the substrate having the interlayer. Inorganic materials include, for example, one or more metals, metal alloys, ceramics and/or refractory oxides. The inorganic materials used in the high temperature/kinetic coating process encompasses molten, semi-molten or solid material that is projected (or projecting toward) the substrate as well as other forms of the inorganic material or precursor thereof, e.g., wire, powder, liquid, metals, metal alloys, ceramics and/or refractory oxides.

Resulting coatings are made by the accumulation of numerous sprayed particles. The surface may not heat up significantly, allowing the coating of low melting temperature substances. The particles, because of their temperature or velocity (kinetic energy) embed in or infuse with at least a portion of the interlayer and/or surface of composite substrate and provide enhanced properties to the composite with reduced or eliminated alteration to the composite's organic matrix as compared to a composite coated in the same way without the presently disclosed interlayer.

Such thermal spraying processes can optionally be operated such that the temperature of the substrate is controlled in a manner that will further minimize or reduce alteration to the organic polymer matrix or reinforcement material.

Thus, in one example of the present method, the thermal spray is carried out with temperature control of the substrate between about 50° C. to about 120° C. to avoid such thermal exposure, or to avoid thermally activated surface reactions, causing surface changes of the substrate. Thermal control of the substrate can be by air and/or liquid cooling of one or more surfaces of the substrate during coating. In certain thermal spray processes, electromagnetic radiation in the form of vacuum UV photons are generated that can penetrate bulk polymers/matrices to a depth of about 10 µm causing chain scissions and cross-linking of the matrix. The substrate can be modified by the use of additives to minimize or eliminate UV related alteration (chemical and/or physical) to the organic polymer matrix and/or reinforcement material.

In one embodiment of the present method, the composite substrate, with interlayer as described above, is subjected to a high temperature or kinetic coating process. As mentioned above, for certain composites, the presence of chemically, mechanically and thermally unstable epoxy resin exacerbates the commercial feasibility of such high temperature or high velocity coated composites. For example, carbon-carbon composites (or CFRPs) have not generally been successfully used with thermally sprayed coatings, further limiting such composites in demanding applications. The present disclosure addresses some if not all of these limitations and provides, in part by way of the introduction of the interlayer, methods and articles of fiber reinforced composites that readily accept such high temperature/kinetic coatings with reduced or eliminated alteration to the composite substrate in comparison to a composite with the interlayer.

In an exemplary embodiment, the present method is described with reference to coating a CFRP composite substrate with the interlayer and subsequently with an inorganic coating, e.g., a metal, a metal alloy, a ceramic, and/or a refractory oxide, so as to allow the composite to be used in demanding applications and/or impart improved properties to the composite. Thus, a thermal spray technique is used to contact the surface of the CFRP composite substrate after the interlayer is deposited, the CFRP composite receiving the high temperature or high velocity inorganic particles with reduced or no alteration to its surface. Other composites, namely fiber reinforced polymer composites can be used.

Any conventional technique for thermal spray coating can be used in the practice of the present disclosure. High temperature and/or kinetic coating techniques alone or in combination with thermal spray techniques can be used. Thus, plasma jet generation of coating precursors can be used, e.g., using direct current (DC plasma), including where the energy is transferred to the plasma jet by a direct current, high-power electric arc. In other aspect, induction plasma or RF plasma can be used, where the energy is transferred by induction, e.g., from a coil around the plasma jet, through which an alternating, radio-frequency current passes. Likewise, plasma-forming media techniques, such as using a gas-stabilized plasma (GSP) using argon, hydrogen, helium or their mixtures, water-stabilized plasma (WSP), or other suitable liquid, or hybrid plasma-forming media, may be used alone or in combination.

In another aspect, deposition of the thermally sprayed material or precursor can be facilitated by air plasma spraying (APS), controlled atmosphere plasma spraying (CAPS), e.g. with inert gas or evacuated chambers, high-pressure plasma spraying (HPPS), low-pressure plasma spraying (LPPS), vacuum plasma spraying (VPS), and high-velocity oxygen fuel (HVOF).

In one aspect, the thermal spraying is combined, sequentially or concurrently with other surface modification and/or coating techniques, for example, etching, argon bombardment, etc. Such additional techniques can be used to further control and/or manipulate the substrate surface (e.g., functionality, hydrophobicity/hydrophilicity), morphology, and/or to create porosity in the coating, and/or for cleaning of the composite. Such additional techniques, when used in combination with the presently disclosed methods and materials, can further improve the finished composite substrate properties, such as its frictional behavior, heat resistance, surface electrical conductivity, lubricity, adhesion strength, dielectric constant, and/or hydrophilicity/hydrophobicity and therefore extend it use to high demanding applications.

In one embodiment, the methods of the present disclosure can be used for restorative (e.g., restoration of repaired/replacement part dimensions) purposes. Exemplary materials suitable for restorative processes include WC—Co—Cr, NiAl, Al, steel (ferrous alloys), titanium (Ti), vanadium (V), and the like.

In another embodiment, the methods of the present disclosure can be used for providing thermal barrier properties to the substrate. Exemplary materials suitable for thermal barrier protection include zirconia, alumina, and yttrium-stabilized zirconium (YSZ). In addition to the thermal barrier coatings above, bonding/adhesive layers can be used in combination therewith, and include, for example, MCrAlY (M: Metals) and NiAl.

In another embodiment, the methods the present disclosure can be used for providing electrical and/or thermal conductivity and include, for example, copper (Cu), silver (Ag), platinum (Pt), palladium (Pd), gold (Au) and alloys thereof. Alternatively, the methods and apparatus of the present disclosure can be used for providing electrical insulation, for example, using ceramics such as aluminum oxide ($Al_2O_3$) and/or other refractory oxides.

In another embodiment, the methods of the present disclosure can be used for providing wear resistance, for example, using WC—Co, WC—CoCr, or for providing high temperature wear resistance, for example, using CrC—NiCr.

In another embodiment, the methods of the present disclosure can also be used for providing corrosion resistance, for example, using nickel (Ni), or high temperature corrosion resistance using, for example, nickel-chromium alloy (NiCr) or aluminum alloys. Likewise, galvanic protection can be provided using zinc and zinc alloys.

In addition to the above, the methods of the present disclosure can also be used for providing low friction (anti-friction) properties, using, for example, molybdenum disulfide ($MoS_2$) and the like.

The inorganic coating applied to the interlayer/substrate by the methods disclosed can be crystalline, semi-crystalline, amorphous, or quasicrystalline, nanocrystalline, or combinations thereof.

Figure 1:
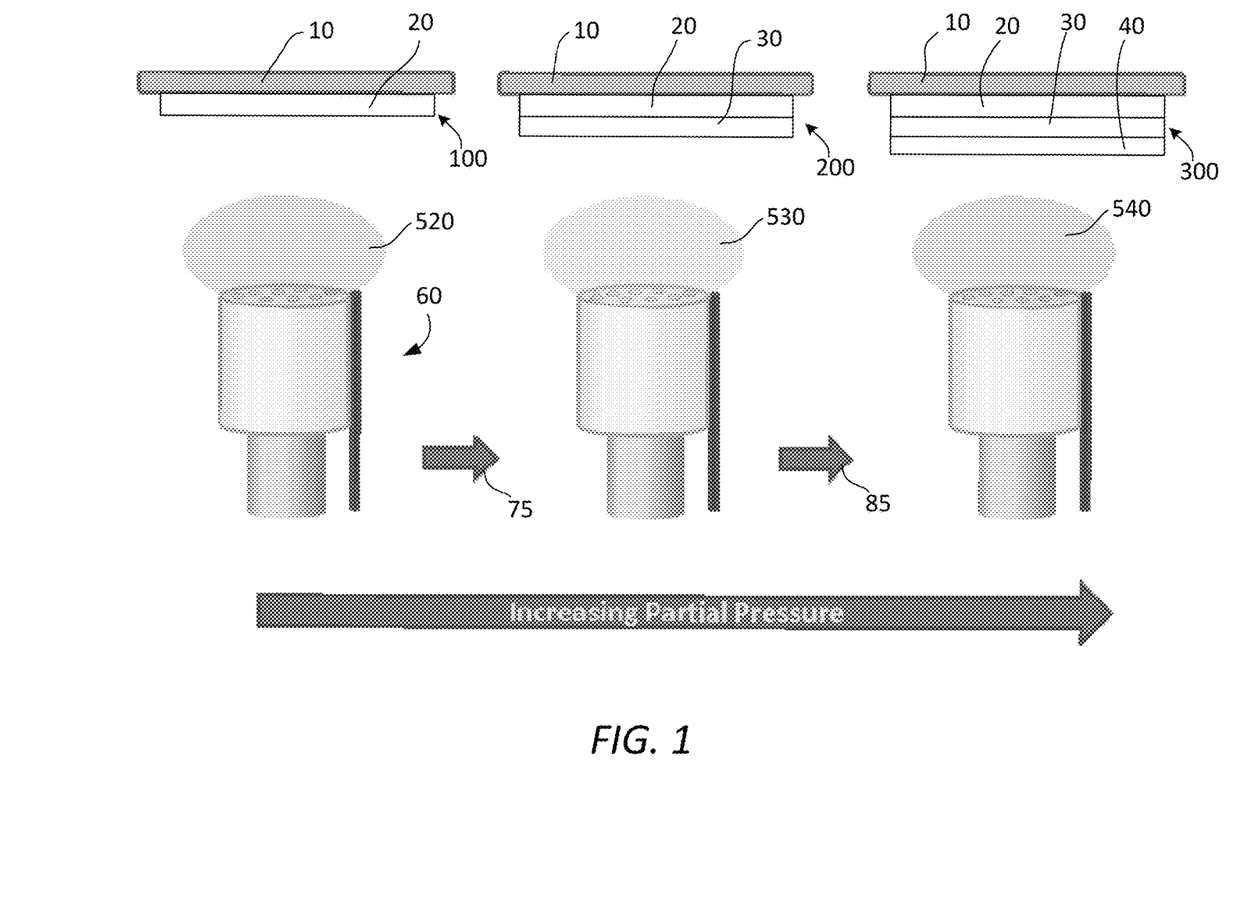
FIG. 1 depicts an exemplary interlayer deposition method embodiment as disclosed and described herein.

With reference to FIG. 1, an illustration, depicting in a general sense, an embodiment of an interlayer deposition method is provided, which exemplifies an RF magnetron sputtering process. Thus, FIG. 1 depicts at a first time interval substrate 10, for example, a composite polymer substrate, having deposited thereon, an interlayer is formed from RF sputtering unit 60 having a first partial pressure of a reactive gas 520 (e.g., oxygen) resulting in interlayer 100 having a first chemical composition 20. After a second time interval indicated by first arrow 75, reactive gas 530 having a partial pressure higher than that of reactive gas 520 provides gradient interlayer 200 having a second chemical composition 30 different from the first chemical composition 20. At this point the process can be terminated. Alternatively or optionally, after a time interval, indicated by arrow 85, reactive gas 540 having a partial pressure higher than that of reactive gas 530 provides interlayer 300 having a third chemical composition 40 different from the second chemical composition 30. Additional layers can be deposited on interlayer 300 as described above. The deposition process illustrated in FIG. 1 can be employed with other reactive gases such as nitrogen, halogens, hydrogen sulfide, etc. Combinations and/or metering of different reactive gases can be used. The presently disclosed process may be configured for an inline-process implementation.

Figure 2A:
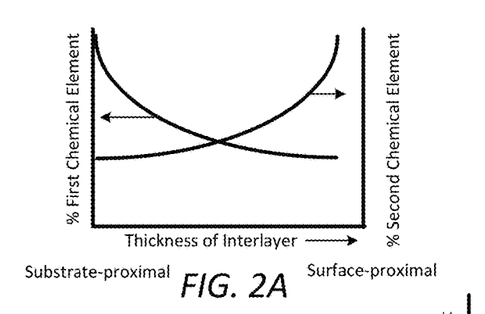
FIGS. 2A-2D illustrates embodiments of an interlayer composition gradient as disclosed and described herein.
Figure 2B:
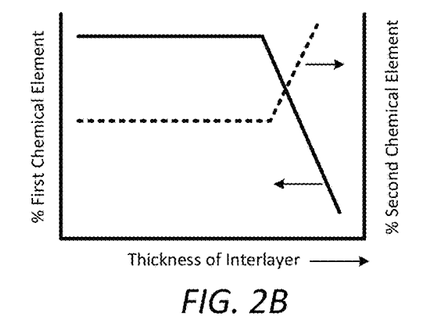
Figure 2C:
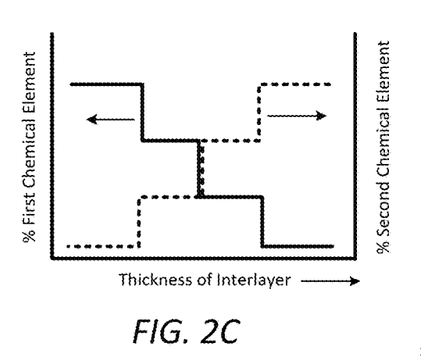
Figure 2D:
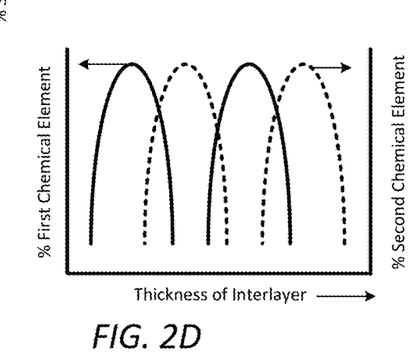
Figure 3:
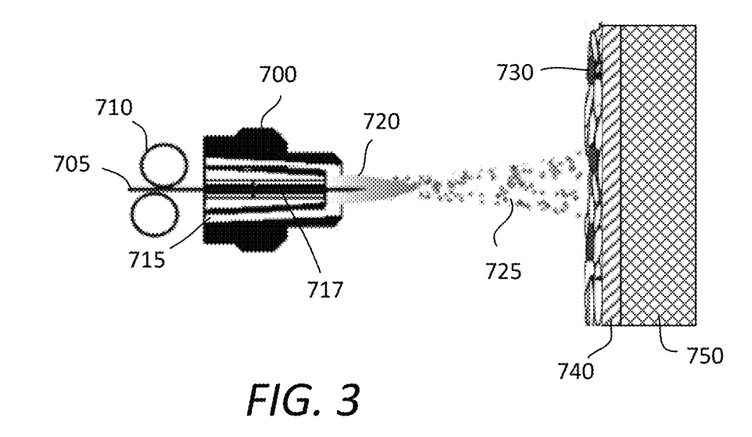
FIG. 3 illustrates an exemplary high temperature/kinetic coating process as disclosed and described herein.

FIG. 2A illustrates a chemical gradient embodiment of the interlayer as disclosed and described herein. Thus, percent of first chemical element decreases as the thickness of the interlayer increases from the substrate-proximal layer, while the percent of second chemical element increases as the thickness of the interlayer increases from the substrate proximal surface (nearest surface-proximal layer). FIG. 2B illustrates an alternate embodiment of the chemical gradient of the interlayer as disclosed and described herein. In FIG. 2B, the interlayer is essentially composed of two layers, the first layer having a percent of the first chemical element decreasing as the thickness of the interlayer increases from the substrate-proximal layer while the percent of the second chemical element increases. FIG. 2C illustrates yet another embodiment of a chemical gradient interlayer as disclosed and described herein. Thus, FIG. 2C shows a step change in the percent of first chemical element, which decreases as the thickness of the interlayer increases from the substrate-proximal layer while the percent of the second chemical element increases. FIG. 2D illustrates yet another embodiment of the chemical gradient interlayer as disclosed and described herein, wherein the percent of the first chemical element increases and then decreases along a predetermined thickness of the interlayer while concurrently the percent of the second chemical element decreases and then increases throughout and overlapping predetermined thickness of the interlayer. The relationship between the first and the second chemical composition is repeated one or more times throughout the interlayer thickness. Other combinations and structural arrangements of the first and the second chemical composition can be employed. Additional chemical compositions (e.g., third, fourth, etc.) can be used Referring now to FIG. 3, a method of coating a substrate having the interlayer using an exemplary high temperature with kinetic coating apparatus is shown. Thus, flame sprayer 700 receives wire 705 (which could be a rod or a cord) from feed apparatus 710 and uses thermal energy from combustion of fuel 717 (e.g., hydrogen, hydrocarbon) with carrier gas 715 (e.g., oxygen and/or argon) to melt the inorganic material 725 in flame 720, which are kinetically driven toward interlayer 740 and composite substrate 750. Inorganic coating 730 results, which can be deposited on or directly deposited onto at least a portion of the interlayer 740 and/or substrate 750. Inorganic coating can be partially embedded or infused with a portion of the interlayer 740 and/or substrate 750, depending on the speed and temperature of the particles impinging on the interlayer and/or substrate. Inorganic coating 730 is the result of one or more impacts of molten and/or semi-molten particles (also referred to as "splats") of inorganic material 725, which typically forms a lamellar structured-film or coating on the interlayer 740 and composite substrate 750. Successive layers of inorganic material 725 can result, which can be anisotropic in property and/or heterogeneous in composition. The molten/semi-molten, heterogeneous state of inorganic material 725 can result porosity of the inorganic coating 730. The coating 730 can contain impurities and/or oxide occlusions.

Figure 4:
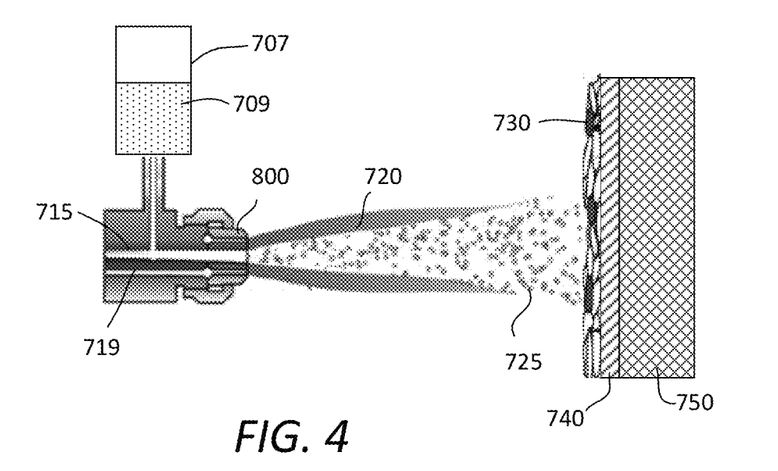
FIG. 4 illustrates another exemplary high temperature/kinetic coating process as disclosed and described herein.

Referring now to FIG. 4, an alternate spray coating apparatus and method is depicted. Thus, powder feed 707 having inorganic source material 709 is configured to feed spray unit 800, which includes compressed gas feed 719 in combination with fuel 715 to drive molten/semi-molten particles 725. In this example, the particle velocities are about 40 m/s to about 200 m/s.

EXPERIMENTAL

The interlayer barrier is deposited with a silicon carbide target and an RF magnetron sputtering source. The first layer is produced in an atmosphere (at $10^{-3}$ Torr vacuum) under zero to low partial pressures of oxygen using a power/target area of 5 W/cm². This layer has high carbon content, making it more compatible with the CFRP. The starting concentration will depend on the nature of the substrate. For example, for substrates with a high relative concentration of carbon, zero partial pressure of oxygen during deposition might be desired to increase compatibility. In a step by step or continuous fashion, the oxygen concentration is gradually increased during deposition, i.e. from zero to 10%. The increase in partial pressure during deposition increases the oxygen relative content in the film. The top layer can be deposited in the presence of oxygen concentrations higher than 10%. This can potentially result in glassier, harder, and more scratch resistant films or coatings. After a multilayer of gradient coating has been deposited to protect the composite material, a thermal spray based or alternate high temperature/high velocity technique can be used to transform the surface electrical, mechanical and/or thermal properties.

The above sample is thermally sprayed as follows: the substrate surface is cleaned by acetone and dried by air prior to coating deposition process. Air cooling is applied on both side of a sample coupon of CFRP that has a SiOC interlayer of between about 50 to about 150 nm during the coating deposition process. About 1 nm to about 100 nm coating of WC—Co is deposited on or deposited directly on the interlayer using thermal spray torch mounted on a robot. The resultant inorganic coated composite has excellent wear resistance.

From the foregoing description, various modifications and changes in the compositions and method will occur to those skilled in the art without varying from the scope of the invention as defined in the following claims.

What is claimed:

1. A composite comprising:
a substrate comprising a reinforced organic polymer matrix, the substrate having a substrate surface;
at least one interlayer of silicon oxycarbide on the substrate surface, the interlayer having a thickness extending vertical from the substrate, and a compositional gradient of at least one chemical element of the silicon oxycarbide within at least a portion of the thickness extending vertical; and
at least one inorganic coating of a ceramic, wherein the ceramic is one or more refractory oxides selected from the group of zirconia, alumina, and yttrium-stabilized zirconium (YSZ), molybdenum disulfide (MoS₂), MCrAIY, wherein M is Co, Ni or Co/Ni, or a combination thereof, the at least one inorganic ceramic coating being at least partially embedded in or infused with the interlayer.

2. The composite of claim 1, wherein the reinforced organic polymer matrix is a fiber reinforced polymer chosen from carbon fiber reinforced polymer, glass fiber reinforced polymer, carbon nanotube reinforced polymer, Kevlar (poly-paraphenylene terephthalamide) fiber reinforced polymer, or ceramic fiber reinforced polymer.

3. The composite of claim 1, wherein the interlayer consists essentially of silicon oxycarbide.

4. The composite of claim 1, wherein the at least one chemical element is oxygen, carbon, nitrogen, sulfur, or halogen.

5. The composite of claim 1, wherein the compositional gradient comprises a varying concentration of the at least one element within the thickness.

6. The composite of claim 1, wherein the varying concentration comprises a carbon-rich interlayer portion in proximity to the substrate and an oxygen-rich, or nitrogen-rich, or nitride-rich interlayer portion in proximity to the inorganic coating.

7. The composite of claim 1, wherein the concentration gradient of the at least one chemical element is essentially linear within the thickness of the interlayer, is essentially step-wise within the thickness of the interlayer, or is a plurality of concentration gradients within the thickness of the interlayer.

8. A method for providing a coated polymeric composite substrate comprising:
(i) depositing, on a polymeric composite substrate surface, by a vapor deposition process, a sputtering process or a plasma enhanced chemical vapor deposition process, a thickness of an interlayer, the interlayer comprising silicon oxycarbide and having a varying concentration gradient of at least one chemical element of the silicon oxycarbide within at least a portion of the thickness;
(ii) depositing, into at least a portion of the interlayer, via a kinetically driven thermal spray process, inorganic material of a ceramic such that the inorganic material is at least partially embedded in or infused with the interlayer, wherein the ceramic is one or more refractory oxides selected from the group of zirconia, alumina, and yttrium-stabilized zirconium (YSZ), molybdenum disulfide (MoS₂), MCrAIY, wherein M is Co, Ni or Co/Ni, or a combination thereof; and
(iii) forming a coating of the inorganic material on at least a portion of the interlayer;
wherein the kinetically driven thermal spray process is exclusive of the vapor deposition process, the sputtering process or the plasma enhanced chemical vapor deposition process of step (i).

9. The method of claim 8, further comprising eliminating or reducing chemical or physical alteration to at least a portion of the composite substrate by the high temperature and/or kinetic inorganic particles.

10. The method of claim 8, wherein the polymeric composite is a fiber reinforced organic polymer matrix chosen from carbon fiber reinforced polymer, glass fiber reinforced polymer, carbon nanotube reinforced polymer, Kevlar (poly-paraphenylene terephthalamide) fiber reinforced polymer or ceramic fiber reinforced polymer.

11. The method of claim 8, wherein the interlayer consists essentially of silicon oxycarbide.

12. The method of claim 8, wherein the interlayer is deposited by a vapor phase deposition technique, a sputtering technique, or plasma deposition technique, or combinations thereof.

13. An article comprising:
a fiber reinforced organic polymer composite substrate;
a thickness of an interlayer consisting essentially of silicon oxy-carbide directly on the composite substrate, the interlayer having a concentration gradient of at least one chemical element of the silicon oxy-carbide within at least a portion of the thickness of the interlayer and the interlayer having an inverse relationship of a concentration of the carbon to the oxygen in a least a portion of the thickness of the interlayer; and
an inorganic coating of a ceramic embedded in or infused with the interlayer as the result of a kinetic thermal spray process, wherein the ceramic is one or more refractory oxides selected from the group of zirconia, alumina, and yttrium-stabilized zirconium (YSZ), molybdenum disulfide ($MoS_2$), or MCrAlY, wherein M is Co, Ni or Co/Ni, or combination thereof, the ceramic, the molybdenum disulfide ($MoS_2$), or the MCrAlY providing one or more of anti-wear, anti-abrasion, anti-corrosion, restorative, electrical and/or thermal conductance, and anti-friction properties to the composite substrate.

14. The article of claim 13, wherein the article is a component of a vehicle, an aerospace vehicle, watercraft, or construction element.

* * * * *

UNITED STATES PATENT AND TRADEMARK OFFICE
CERTIFICATE OF CORRECTION

PATENT NO. : 10,060,019 B2
APPLICATION NO. : 13/679399
DATED : August 28, 2018
INVENTOR(S) : Alpana N. Ranade, Marvi A. Matos and Arash Ghabchi It is certified that error appears in the above-identified patent and that said Letters Patent is hereby corrected as shown below:

In the Claims

In Column 11, please change Line 64 to:
"MCrAlY, wherein M is Co, Ni or Co/Ni, or a combi-"

In Column 12, please change Line 44 to:
"denum disulfide ($MoS_2$), MCrAlY, wherein M is Co, Ni"

Signed and Sealed this
Twenty-third Day of October, 2018

Andrei Iancu
*Director of the United States Patent and Trademark Office*